United States Patent
Hong

(10) Patent No.: US 9,466,391 B2
(45) Date of Patent: Oct. 11, 2016

(54) SEMICONDUCTOR DEVICE HAVING FUSE ARRAY WITH DISCONNECTABLE VOLTAGE GENERATOR AND METHOD OF OPERATING THE SAME

(71) Applicant: SK hynix Inc., Gyeonggi-do (KR)

(72) Inventor: Yun-Seok Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/301,003

(22) Filed: Jun. 10, 2014

(65) Prior Publication Data

US 2015/0194221 A1    Jul. 9, 2015

(30) Foreign Application Priority Data

Jan. 9, 2014   (KR) .......................... 10-2014-0002975

(51) Int. Cl.
| | |
|---|---|
| G11C 17/16 | (2006.01) |
| G11C 17/14 | (2006.01) |
| G11C 5/14 | (2006.01) |
| G11C 17/18 | (2006.01) |
| G11C 29/44 | (2006.01) |

(52) U.S. Cl.
CPC ............... G11C 17/16 (2013.01); G11C 5/145 (2013.01); G11C 17/14 (2013.01); G11C 17/18 (2013.01); G11C 2029/4402 (2013.01)

(58) Field of Classification Search
CPC ......... G11C 17/14; G11C 17/18; G11C 5/14; G11C 17/16; G11C 11/4074
See application file for complete search history.

(56) References Cited

U.S. PATENT DOCUMENTS

| | | | | |
|---|---|---|---|---|
| 6,240,033 | B1 * | 5/2001 | Yang et al. ................. | 365/225.7 |
| 7,902,902 | B2 * | 3/2011 | Chu et al. ...................... | 327/525 |
| 2005/0231266 | A1 * | 10/2005 | Lee ...................... | G11C 11/4085 327/536 |
| 2006/0244518 | A1 * | 11/2006 | Byeon et al. .................. | 327/536 |
| 2009/0134935 | A1 * | 5/2009 | Chu et al. ...................... | 327/525 |
| 2013/0169353 | A1 * | 7/2013 | Kim .............................. | 327/538 |
| 2014/0068321 | A1 * | 3/2014 | Kim et al. ...................... | 714/6.3 |

FOREIGN PATENT DOCUMENTS

| | | |
|---|---|---|
| KR | 1020110060719 | 6/2011 |
| KR | 1020120070440 | 6/2012 |

\* cited by examiner

*Primary Examiner* — Son Dinh
*Assistant Examiner* — Jerome Leboeuf
(74) *Attorney, Agent, or Firm* — IP & T Group LLP

(57) ABSTRACT

A semiconductor device that includes a fuse array including a plurality of fuses, and suitable for operating using a fuse operation voltage in a fuse operation period, a first voltage generation block suitable for generating an internal voltage based on a first target level, a second voltage generation block suitable for generating the fuse operation voltage based on a second target level in the fuse operation period, and generating the fuse operation voltage based on the first target level outside the fuse operation period, and a connection control block suitable for disconnecting a line of the internal voltage and a line of the fuse operation voltage in the fuse operation period, and connecting the line of the internal voltage and the line of the fuse operation voltage outside the fuse operation period.

20 Claims, 3 Drawing Sheets

SEMICONDUCTOR DEVICE HAVING FUSE ARRAY WITH DISCONNECTABLE VOLTAGE GENERATOR AND METHOD OF OPERATING THE SAME

CROSS-REFERENCE TO RELATED APPLICATIONS

The present application claims priority of Korean Patent Application No. 10-2014-0002975, filed on Jan. 9, 2014, which is incorporated herein by reference in its entirety.

BACKGROUND

1. Field

Exemplary embodiments of the present disclosure relate to a semiconductor design technology, and more particularly, to a semiconductor device including a fuse array.

2. Description of the Related Art

Semiconductor devices generally have redundancy circuits for repairing failures that occur in internal circuits due to process imperfections.

For example, a large number of memory cells each having the same patterns are integrated in a memory chip (i.e., a semiconductor memory device). If a failure occurs in any one of the memory cells, the corresponding memory chip may be labeled as a defective product and discarded. As memory chips become more highly integrated, the number of memory cells increases. As the number of memory cells increase, the number of memory chips that are also increases, and due to this fact, mass-production of memory chips may be hindered. In order to repair defective cells, a conventional semiconductor memory device may utilize a fuse circuit and a redundancy cell array.

The fuse circuit may be used to set a specific value determined of defective memory cells through testing of the semiconductor device.

Recently, E-fuse circuits have been used as fuse circuits. Basically, an E-fuse circuit includes a transistor to be programmed in such a way as to rupture a gate dielectric by applying a high electric field to a gate electrode.

While an E-fuse circuit may be realized in various ways, an array E-fuse (ARE) circuit having unit fuse cells that are arranged in an array pattern is widely used. In general, the data programmed in the ARE circuit is read in the initializing (i.e., power-up) operation of a semiconductor device and is stored in registers, and then the stored data is used for the general operation of the semiconductor device. Such an operation of storing the programmed data in the registers is referred to as a boot-up operation.

A high voltage (or a boosted voltage) source, which is not used for general operation, is used for programming and reading the ARE circuit, and thus it may be important to stably generate such a high voltage.

It is assumed that a cell array for storing data is included in a semiconductor memory device, and even when a rupture voltage in an ARE circuit is not directly used in the operation of the cell array, the durability and reliability of the cell array may be degraded by a high rupture voltage.

SUMMARY

Various embodiments are directed to a semiconductor device that may generate high voltages having different target levels for a fuse array and an internal circuit, and may minimize impact exerted on the fuse array and the internal circuit, and a method of operating the same.

In an embodiment, a semiconductor device may include a fuse array including a plurality of fuses, and suitable for operating using a fuse operation voltage in a fuse operation period, a first voltage generation block suitable for generating an internal voltage based on a first target level, a second voltage generation block suitable for generating the fuse operation voltage based on a second target level in the fuse operation period, and generating the fuse operation voltage based on the first target level outside the fuse operation period, and a connection control block suitable for disconnecting a line of the internal voltage and a line of the fuse operation voltage in the fuse operation period, and connecting the line of the internal voltage and the line of the fuse operation voltage outside the fuse operation period.

In an embodiment, a semiconductor device may include a fuse array including a plurality of fuses, and suitable for rupturing preset data by using a rupture voltage in a rupture operation period, a first voltage generation block suitable for generating a boosted voltage based on a first target level, a second voltage generation block suitable for generating the rupture voltage based on a second target level in the rupture operation period, and generating the rupture voltage based on the first target level outside the rupture operation period, and a first connection control block suitable for disconnecting a line of the boosted voltage and a line of the rupture voltage in the rupture operation period, and connecting the line of the boosted voltage and the line of the rupture voltage outside the rupture operation period.

In an embodiment, a method of operating a semiconductor device including a fuse array and an internal circuit may include generating a fuse operation voltage for the fuse array based on a first target level in a fuse operation period while disconnecting a line of the fuse operation voltage and a line of an internal voltage for the internal circuit, and generating the fuse operation voltage based on a second target level, which is lower than the first target level, outside the fuse operation period while connecting the line of the fuse operation voltage and the line of the internal voltage.

DETAILED DESCRIPTION

Figure 1:
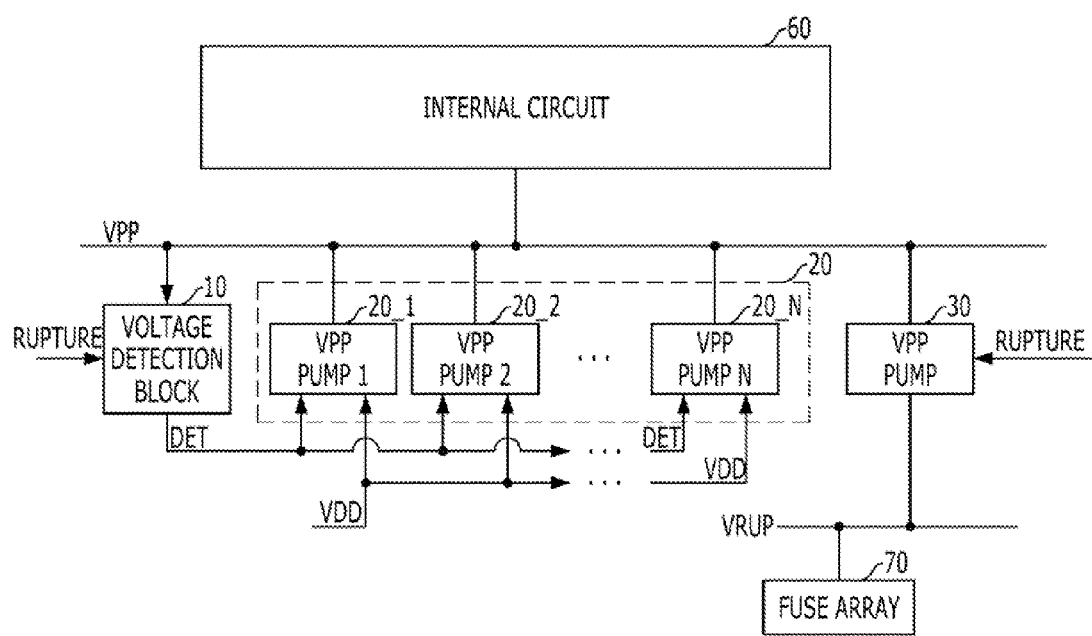
FIG. 1 is a block diagram showing a semiconductor device including a circuit for generating a rupture voltage to be used in a fuse array.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

FIG. 1 is a block diagram showing a semiconductor device including a circuit for generating a rupture voltage to be used in a fuse array.

Referring to FIG. 1, the semiconductor device includes a voltage detection block 10, a first voltage generation block 20, a second voltage generation block 30, an internal circuit 60, and a fuse array 70.

The voltage detection block 10 detects the level ("level" referring to a voltage reading) of the line of a boosted voltage VPP, based on a preset target level (or a reference level). The preset target level may be varied to either of two levels based on a rupture operation signal RUPTURE. That is, in a rupture operation period in which the rupture operation signal RUPTURE is activated, the level of the line of the boosted voltage VPP is detected based on a first normal target level with a relatively higher level. Conversely, in an exit state of a rupture operation period in which the rupture operation signal RUPTURE is deactivated, the level of the line of the boosted voltage VPP is detected based on a second normal target level with a relatively lower level.

The first voltage generation block 20 charge-pumps the line of the boosted voltage VPP to the preset target level in response to an output signal DET of the voltage detection block 10. A charge pumping operation is performed based on the level of a power supply voltage VDD. In other words, the line of the boosted voltage VPP is charge-pumped to the preset target level by using the power supply voltage VDD.

The second voltage generation block 30 charge-pumps the line of a rupture voltage VRUP to a rupture target level, based on the level of the line of the boosted voltage VPP in the activation period of the rupture operation signal RUPTURE. Namely, the line of the rupture voltage VRUP is charge-pumped to the rupture target level by using the boosted voltage VPP.

The internal circuit 60 performs a preset operation by using the boosted voltage VPP, which has the second normal target level with a relatively lower level.

The fuse array 70 includes a plurality of fuses (not shown), which are disposed in an array pattern, and performs a rupture operation for each of the plurality of fuses, by using the rupture voltage VRUP, which has the rupture target level.

In the semiconductor device configured as mentioned above, it may be seen that the configuration of the first voltage generation block 20, which generates the boosted voltage VPP to be used in a preset operation of the internal circuit 60 and the configuration of the second voltage generation block 30, which generates the rupture voltage VRUP to be used in a rupture operation of the fuse array 70, are separated from each other.

The reasons for this are as follows.

First, the level of the rupture voltage VRUP for rupturing the fuse array 70 corresponds to a voltage level that is approximately 4 to 5 times higher than the level of the power supply voltage VDD. For example, when the level of the power supply voltage VDD is approximately 1.8V, the level of the rupture voltage VRUP is approximately 5.5V.

Conversely, the level of the boosted voltage VPP used for performing a preset operation in the internal circuit 60 corresponds to a voltage level that is approximately 2 to 3 times higher than the level of the power supply voltage VDD. For example, when the level of the power supply voltage VDD is approximately 1.8V, the level of the boosted voltage VPP is approximately 3V.

That is, the difference between the target level of the boosted voltage VPP and the target level of the rupture voltage VRUP is large. Further, since the level of the rupture voltage VRUP is approximately 4 to 5 times higher than the level of the power supply voltage VDD, it may be difficult to generate the rupture voltage VRUP through a single pumping operation. Even when the rupture voltage VRUP is generated through single charge pumping, the rupture voltage VRUP is likely to become unstable.

Therefore, as shown in FIG. 1, the rupture voltage VRUP is generated in such a manner that the level of the boosted voltage VPP generated in advance by charge-pumping the power supply voltage VDD is charge-pumped again.

However, if the boosted voltage VPP is generated and then the rupture voltage VRUP is generated using the boosted voltage VPP, the durability or reliability of the internal circuit 60 is likely to be degraded.

The reason for this will be described below.

Since the target level of the rupture voltage VRUP is high, the target level of the boosted voltage VPP, which is generated in the rupture operation period should be higher than the target level of the boosted voltage VPP used for the preset operation of the internal circuit 60 outside the rupture operation period. To this end, the voltage detection block 10 selectively changes the target level of the boosted voltage VPP between the first normal target level with a relatively higher level and the second normal target level with a relatively lower level according to entry or exit of a rupture operation period.

The internal circuit 60 is generally designed to use the boosted voltage VPP, which is defined as the second normal target level with a relatively lower level. In this regard, if the boosted voltage VPP defined as the first normal target level with a relatively higher level is applied to the internal circuit 60 as it is, in the rupture operation period, the durability or reliability of the internal circuit 60 is likely to be degraded.

Figure 2:
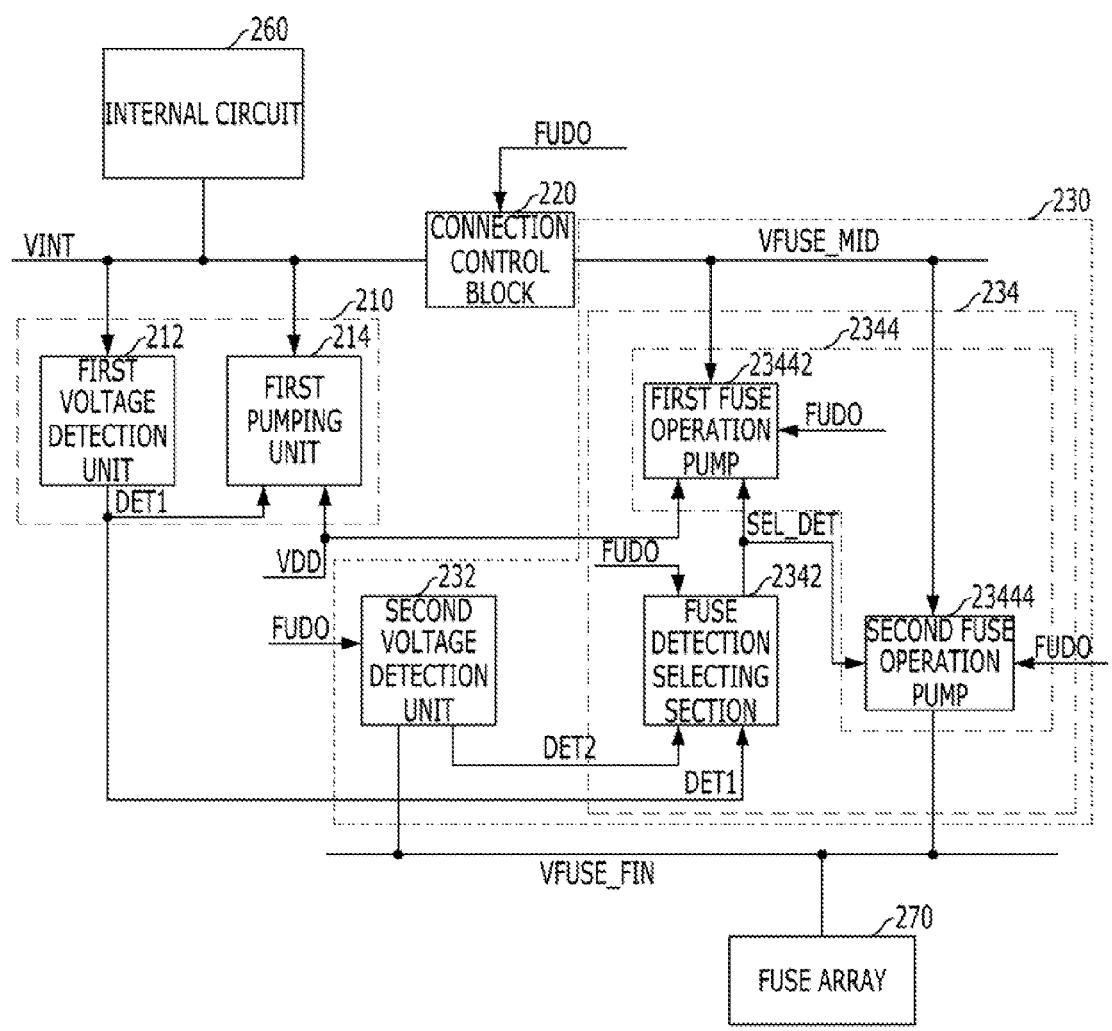
FIG. 2 is a block diagram showing a semiconductor device including a circuit for generating a fuse operation voltage to be used in a fuse array in accordance with an embodiment of the present invention.

FIG. 2 is a block diagram showing a semiconductor device including a circuit for generating a fuse operation voltage to be used in a fuse array in a semiconductor device in accordance with an embodiment of the present invention.

Referring to FIG. 2, the semiconductor device may include a first voltage generation block 210, a second voltage generation block 230, a connection control block 220, an internal circuit 260, and a fuse array 270. The first voltage generation block 210 may include a first voltage detection unit 212 and a first pumping unit 214. The second voltage generation block 230 may include a second voltage detection unit 232 and a second pumping unit 234. The second pumping unit 234 may include a fuse detection selecting section 2342 and a fuse pumping operating section 2344. The fuse pumping operating section 2344 may include a first fuse operation pump 23442 and a second fuse operation pump 23444.

The fuse array 270 includes a plurality of fuses (not shown), and operates using a fuse operation voltage VFUSE in a fuse operation period. Entry or exit of a fuse operation period is determined according to the value of a fuse operation signal FUDO. In other words, the fuse operation period corresponds to an activated period of the fuse operation signal FUDO, and the fuse operation signal FUDO is deactivated outside the fuse operation period.

The internal circuit 260 performs a preset operation using an internal voltage VINT. The preset operation of the internal circuit 260 may be performed regardless of the fuse operation period. Of course, the internal circuit 260 may perform no operation in the fuse operation period and may perform the preset operation outside the fuse operation period.

The first voltage generation block 210 generates the internal voltage VINT based on a first target level. If the internal circuit 260 is to perform regardless of the fuse operation period, the first voltage generation block 210 may be enabled both in and outside the fuse operation period and may generate the internal voltage VINT based on the first target level. Of course, if the internal circuit 260 is to perform no operation in the fuse operation period, the first voltage generation block 210 may be disabled in the fuse operation period. That is, the first voltage generation block 210 may be enabled and generate the internal voltage VINT based on the first target level only outside the fuse operation period.

In the semiconductor device in accordance with the embodiment of the present invention, the line of the internal voltage VINT and the line of the fuse operation voltage VFUSE may be completely disconnected from each other by the connection control block 220. Accordingly, the operation period of the first voltage generation block 210 may be determined regardless of the entry and exit of the fuse operation period.

In detail, the connection control block 220 disconnects the line of the internal voltage VINT and the line of the fuse operation voltage VFUSE in the fuse operation period, and connects the line of the internal voltage VINT and the line of the fuse operation voltage VFUSE outside the fuse operation period. Namely, the connection control block 220 disconnects the line of the internal voltage VINT and the line of the fuse operation voltage VFUSE in the fuse operation period in which the fuse operation voltage VFUSE is used in the fuse array 270, such that the line of the internal voltage VINT and the line of the fuse operation voltage VFUSE may be used independently of each other. Conversely, the connection control block 220 connects the line of the internal voltage VINT and the line of the fuse operation voltage VFUSE outside the fuse operation period in which the fuse operation voltage VFUSE is not used in the fuse array 270, such that the line of the internal voltage VINT and the line of the fuse operation voltage VFUSE may be used when they are combined with each other. Since the second voltage generation block 230 generates the fuse operation voltage VFUSE having the first target level or generates the fuse operation voltage VFUSE having a second target level, according to the exit or entry of the fuse operation period, the line of the internal voltage VINT and the line of the fuse operation voltage VFUSE may be normally connected with each other outside the fuse operation period in which the fuse operation voltage VFUSE is not used in the fuse array 270.

In detail the second voltage generation block 230 generates the fuse operation voltage VFUSE based on the second target level in the fuse operation period, and generates the fuse operation voltage VFUSE based on the first target level outside the fuse operation period.

The second voltage detection unit 232 detects the level of the line of the fuse operation voltage VFUSE based on the second target level in the fuse operation period.

The second pumping unit 234 charge-pumps the line of the fuse operation voltage VFUSE to the first target level in response to an output signal DET1 of the first voltage detection unit 212 outside the fuse operation period. That is, the second pumping unit 234 causes the level of the line of the fuse operation voltage VFUSE to be the same as the level of the line of the internal voltage VINT, outside the fuse operation period. Conversely, the second pumping unit 234 charge-pumps the line of the fuse operation voltage VFUSE to the second target level in response to an output signal DET2 of the second voltage detection unit 232 in the fuse operation period. That is, the second pumping unit 234 causes the level of the line of the fuse operation voltage VFUSE to be different from the level of the line of the internal voltage VINT, in the fuse operation period.

The fuse detection selecting section 2342 selects the output signal DET1 of the first voltage detection unit 212 and outputs it as a signal SEL_DET outside the fuse operation period, and selects the output signal DET2 of the second voltage detection unit 232 and outputs it as the signal SEL_DET in the fuse operation period. That is, the signal SEL_DET outputted from the fuse detection selecting section 2342 is the output signal DET1 of the first voltage detection unit 212 outside the fuse operation period, and is the output signal DET2 of the second voltage detection unit 232 in the fuse operation period.

The fuse pumping operating section 2344 charge-pumps the line of the fuse operation voltage VFUSE to the first target level in response to the signal SEL_DET outputted from the fuse detection selecting section 2342 outside the fuse operation period. Furthermore, the fuse pumping operating section 2344 charge-pumps the line of the fuse operation voltage VFUSE to the first target level and then charge-pumps the line of the fuse operation voltage VFUSE to the second target level, in response to the signal SEL_DET outputted from the fuse detection selecting section 2342 in the fuse operation period.

In other words, the fuse pumping operating section 2344 charge-pumps the line of the fuse operation voltage VFUSE to the first target level outside the fuse operation period in which the line of the fuse operation voltage VFUSE and the line of the internal voltage VINT are connected with each other by the connection control block 220. Accordingly, outside the fuse operation period, the line of the fuse operation voltage VFUSE and the line of the internal voltage VINT may have the same level. The internal voltage VINT and the fuse operation voltage VFUSE, which are generated by the first voltage generation block 210 and the second voltage generation block 230 outside the fuse operation period and have the first target level, are applied to the internal circuit 260 and are used to perform the preset operation. Since the fuse array 270 does not perform any operation outside the fuse operation period, the internal voltage VINT and the fuse operation voltage VFUSE do not flow to the fuse array 270.

Further, the fuse pumping operating section 2344 charge-pumps the line of the fuse operation voltage VFUSE to the second target level in the fuse operation period in which the line of the fuse operation voltage VFUSE and the line of the internal voltage VINT are not connected with each other by the connection control block 220. Accordingly, the fuse operation voltage VFUSE with the second target level does not flow to the line of the internal voltage VINT. Due to this fact, the internal circuit 260 may be exerted with no influence from the fuse operation voltage VFUSE with the second target level. Conversely, the fuse array 270 may perform a normal fuse operation by being applied with the fuse operation voltage VFUSE with the second target level. When the fuse pumping operating section 2344 charge-pumps the line of the fuse operation voltage VFUSE to the second target level, it may be seen that the fuse pumping operating section 2344 charge-pumps the line of the fuse operation voltage VFUSE to the first target level and then charge-pumps the line of the fuse operation voltage VFUSE to the second target level. This is caused by the assumption that the second target level is substantially higher than the first target level and pumping the level of a power supply voltage VDD to the second target level at once may be difficult. Otherwise, the fuse pumping operating section 2344 may operate in such a way as to charge-pump the line of the fuse operation voltage VFUSE to the second target level at once.

The first fuse operation pump 23442 charge-pumps an intermediate pumping line VFUSE_MID of the line of the fuse operation voltage VFUSE to the first target level in response to the output signal SEL_DET of the fuse detection selecting section 2342.

The second fuse operation pump 23444 starts to operate after the operation of the first fuse operation pump 23442 is completed in the fuse operation period, and charge-pumps a final pumping line VFUSE_FIN of the line of the fuse operation voltage VFUSE to the second target level based on the voltage level of the intermediate pumping line VFUSE_MID in response to the output signal SEL_DET of the fuse detection selecting section 2342.

The case where the first fuse operation pump 23442 always operates regardless of the fuse operation period results from the assumption that the second target level is substantially higher than the first target level and it is not easy to stably pump the level of the power supply voltage VDD to the second target level at once. Otherwise, the line of the fuse operation voltage VFUSE is not divided into the intermediate pumping line VFUSE_MID and the final pumping line VFUSE_FIN and the second fuse operation pump 23444 charge-pumps the line of the fuse operation voltage VFUSE directly to the second target level when the first fuse operation pump 23442 is disabled.

Figure 3:
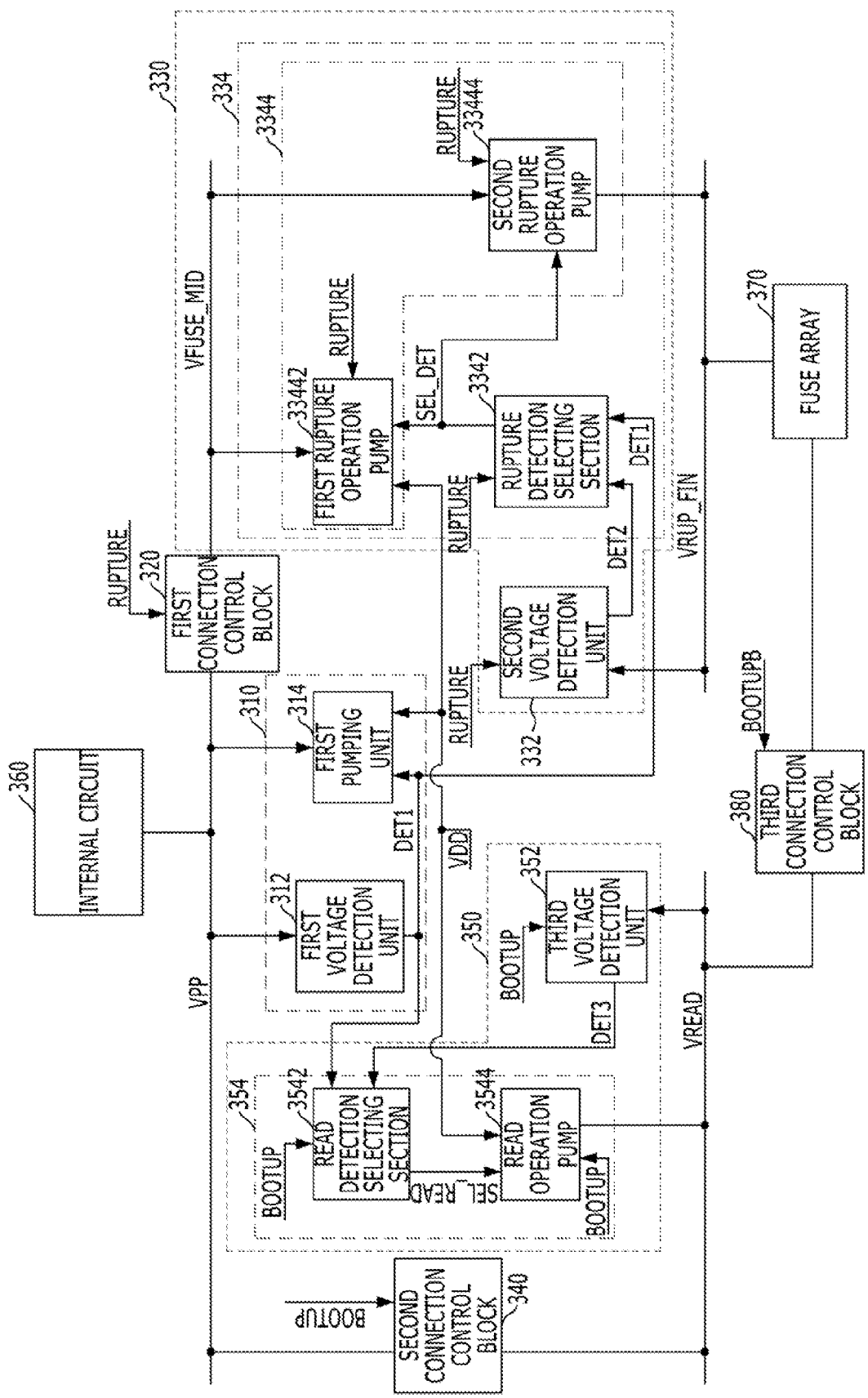
FIG. 3 is a block diagram showing a semiconductor device including a circuit for generating a rupture voltage and a read voltage to be used in a fuse array in accordance with an embodiment of the present invention.

FIG. 3 is a block diagram showing a semiconductor device including a circuit for generating a rupture voltage and a read voltage to be used in a fuse array in a semiconductor device in accordance with an embodiment of the present invention.

Referring to FIG. 3, the semiconductor device may include a first voltage generation block 310, a second voltage generation block 330, a third voltage generation block 350, a first connection control block 320, a second connection control block 340, a third connection control block 380, an internal circuit 360, and a fuse array 370. The first voltage generation block 310 may include a first voltage detection unit 312 and a first pumping unit 314. The second voltage generation block 330 may include a second voltage detection unit 332 and a second pumping unit 334. The second pumping unit 334 may include a rupture detection selecting section 3342 and a rupture pumping operating section 3344. The rupture pumping operating section 3344 may include a first rupture operation pump 33442 and a second rupture operation pump 33444. The third voltage generation block 350 may include a third voltage detection unit 352 and a third pumping unit 354. The third pumping unit 354 may include a read detection selecting section 3542 and a read operation pump 3544.

The fuse array 370 includes a plurality of fuses (not shown), and operates using a rupture operation voltage VRUP in a rupture operation period. Entry or exit of a rupture operation period is determined according to the value of a rupture operation signal RUPTURE. In other words, the rupture operation period corresponds to an activated period of the rupture operation signal RUPTURE, and corresponds to a period in which the rupture operation signal RUPTURE is deactivated outside the rupture operation period.

Furthermore, the fuse array 370 operates using a read operation voltage VREAD in a boot-up operation period. Entry or exit of a boot-up operation period is determined according to the value of a boot-up signal BOOTUP. In other words, the boot-up operation period corresponds to an activated period of the boot-up signal BOOTUP, and the boot-up signal BOOTUP is deactivated outside the boot-up operation period.

The fuse array 370 may not simultaneously enter the rupture operation period and the boot-up operation period. Namely, the rupture operation period corresponds to an exit state of the boot-up operation period. Of course, the boot-up operation period corresponds to an exit state of the rupture operation period. The rupture operation period and the boot-up operation period may be simultaneously exited.

The internal circuit 360 performs a preset operation using a boosted voltage VPP. The preset operation of the internal circuit 360 may be performed regardless of the rupture operation period. Of course, the internal circuit 360 may perform no operation in the rupture operation period and may perform the preset operation outside the rupture operation period. Further, the preset operation of the internal circuit 360 may be performed regardless of the boot-up operation period. Of course, the internal circuit 360 may perform no operation in the boot-up operation period and may perform the preset operation outside the boot-up operation period. Therefore, when the rupture operation period and the boot-up operation period are simultaneously exited, the fuse array 370 performs no operation and only the internal circuit 360 performs the preset operation.

The first voltage generation block 310 generates the boosted voltage VPP based on a first target level. When the preset operation of the internal circuit 360 is performed regardless of the operation period, the first voltage generation block 310 may always be enabled regardless of the operation period and generate the boosted voltage VPP based on the first target level.

Of course, when the internal circuit 360 performs no operation in the rupture operation period and the boot-up operation period and performs the preset operation only outside the rupture operation period and the boot-up operation period, the first voltage generation block 310 may be disabled and perform no operation in the rupture operation period and the boot-up operation period and may be enabled and generate the boosted voltage VPP based on the first target level only outside the rupture operation period and the boot-up operation period.

The operation period of the first voltage generation block 310 may be determined regardless of the rupture operation period in the semiconductor device since operations may be performed in the state in which the line of the boosted voltage VPP and the line of the rupture operation voltage VRUP are completely disconnected from each other by the first connection control block 320. Moreover, the operation period of the first voltage generation block 310 may be determined regardless of the boot-up operation period since operations may be performed when the line of the boosted voltage VPP and the line of the read operation voltage VREAD are completely disconnected from each other by the second connection control block 340 and operations may be performed when the line of the read operation voltage VREAD and the fuse array 370 are completely disconnected from each other by the third connection control block 380.

In detail, the first connection control block 320 disconnects the line of the boosted voltage VPP and the line of the rupture operation voltage VRUP in the rupture operation period, and connects the line of the boosted voltage VPP and the line of the rupture operation voltage VRUP outside the rupture operation period. Namely, the first connection control block 320 disconnects the line of the boosted voltage VPP and the line of the rupture operation voltage VRUP in the rupture operation period in which the rupture operation voltage VRUP is used in the fuse array 370, such that the line of the boosted voltage VPP and the line of the rupture operation voltage VRUP may be used completely independent of each other. Conversely, the first connection control block 320 connects the line of the boosted voltage VPP and the line of the rupture operation voltage VRUP outside the rupture operation period in which the rupture operation voltage VRUP is not used in the fuse array 370, such that the line of the boosted voltage VPP and the line of the rupture operation voltage VRUP may be used when they are combined with each other. Since the second voltage generation block 330 generates the rupture operation voltage VRUP having the first target level or generates the rupture operation voltage VRUP having a second target level, according to the exit or entry of the rupture operation period, the line of the boosted voltage VPP and the line of the rupture operation voltage VRUP may be normally connected with each other outside the rupture operation period in which the rupture operation voltage VRUP is not used in the fuse array 370.

In detail, the second voltage generation block 330 generates the rupture operation voltage VRUP based on the second target level in the rupture operation period, and generates the rupture operation voltage VRUP based on the first target level outside the rupture operation period.

The second voltage detection unit 332 detects the level of the line of the rupture operation voltage VRUP based on the second target level in the rupture operation period.

The second pumping unit 334 charge-pumps the line of the rupture operation voltage VRUP to the first target level in response to an output signal DET1 of the first voltage detection unit 312 outside the rupture operation period. That is, the second pumping unit 334 causes the level of the line of the rupture operation voltage VRUP to be the same as the level of the line of the boosted voltage VPP, outside the rupture operation period. Conversely, the second pumping unit 334 charge-pumps the line of the rupture operation voltage VRUP to the second target level in response to an output signal DET2 of the second voltage detection unit 332 in the rupture operation period. That is, the second pumping unit 334 causes the level of the line of the rupture operation voltage VRUP to be different from the level of the line of the boosted voltage VPP, in the rupture operation period.

The rupture detection selecting section 3342 selects the output signal DET1 of the first voltage detection unit 312 and outputs it as a signal SEL_DET outside the rupture operation period, and selects the output signal DET2 of the second voltage detection unit 332 and outputs it as the signal SEL_DET in the rupture operation period. That is, the signal SEL_DET outputted from the rupture detection selecting section 3342 is the output signal DET1 of the first voltage detection unit 312 outside the rupture operation period, and is the output signal DET2 of the second voltage detection unit 332 in the rupture operation period.

The rupture pumping operating section 33444 charge-pumps the line of the rupture operation voltage VRUP to the first target level in response to the signal SEL_DET outputted from the rupture detection selecting section 3342 outside the rupture operation period. Furthermore, the rupture pumping operating section 3344 charge-pumps the line of the rupture operation voltage VRUP to the first target level and then charge-pumps the line of the rupture operation voltage VRUP to the second target level, in response to the signal SEL_DET outputted from the rupture detection selecting section 3342 in the rupture operation period.

In other words, the rupture pumping operating section 3344 charge-pumps the line of the rupture operation voltage VRUP to the first target level outside the rupture operation period in which the line of the rupture operation voltage VRUP and the line of the boosted voltage VPP are connected with each other by the first connection control block 320. Accordingly, outside the rupture operation period, the line of the rupture operation voltage VRUP and the line of the boosted voltage VPP may have the same level. The boosted voltage VPP and the rupture operation voltage VRUP, which are generated by the first voltage generation block 310 and the second voltage generation block 330 outside the rupture operation period and have the first target level, are applied to the internal circuit 360 and are used to perform the preset operation. Since the fuse array 370 does not perform any operation outside the rupture operation period, the boosted voltage VPP and the rupture operation voltage VRUP do not flow to the fuse array 370.

Further, the rupture pumping operating section 3344 charge-pumps the line of the rupture operation voltage VRUP to the second target level in the rupture operation period in which the line of the rupture operation voltage VRUP and the line of the boosted voltage VPP are not connected with each other by the first connection control block 320. Accordingly, the rupture operation voltage VRUP with the second target level does not flow to the line of the boosted voltage VPP. Due to this fact, the internal circuit 360 may be exerted with no influence from the rupture operation voltage VRUP with the second target level. Conversely, the fuse array 370 may perform a rupture operation for storing preset data therein, by being applied with the rupture operation voltage VRUP with the second target level. When the rupture pumping operating section 3344 charge-pumps the line of the rupture operation voltage VRUP to the second target level, it may be seen that the rupture pumping operating section 3344 charge-pumps the line of the rupture operation voltage VRUP to the first target level and then charge-pumps the line of the rupture operation voltage VRUP to the second target level. This is caused by the assumption that the second target level of the rupture operation voltage VRUP is substantially higher than the first target level of the boosted voltage VPP and pumping the level of a power supply voltage VDD to the second target level of the rupture operation voltage VRUP at once may be difficult. Furthermore, since the second target level is higher than the first target level, even when the boosted voltage VPP and the rupture operation voltage VRUP with the first target level that is relatively low are transmitted to the fuse array 370 outside the rupture operation period, no substantial influence is exerted on the fuse array 370. Therefore, a separate connection control circuit may not be provided between the line of the rupture operation voltage VRUP and the fuse array 370. Of course, whether to provide a separate connection control circuit between the line of the rupture operation voltage VRUP and the fuse array 370 is a designer's option.

The first rupture operation pump 33442 charge-pumps an intermediate pumping line VRUP_MID of the line of the rupture operation voltage VRUP to the first target level in response to the output signal SEL_DET of the rupture detection selecting section 3342.

The second rupture operation pump 33444 starts to operate after the operation of the first rupture operation pump 33442 is completed in the rupture operation period, and charge-pumps a final pumping line VRUP_FIN of the line of the rupture operation voltage VRUP to the second target level based on the voltage level of the intermediate pumping line VRUP_MID in response to the output signal SEL_DET of the rupture detection selecting section 3342.

The second connection control block 340 disconnects the line of the boosted voltage VPP and the line of the read operation voltage VREAD in the boot-up operation period, and connects the line of the boosted voltage VPP and the line of the read operation voltage VREAD outside the boot-up operation period. Namely, the second connection control block 340 disconnects the line of the boosted voltage VPP and the line of the read operation voltage VREAD in the boot-up operation period in which the read operation voltage VREAD is used in the fuse array 370, such that the line of the boosted voltage VPP and the line of the read operation voltage VREAD may be used completely independent of each other. Conversely, the second connection control block 340 connects the line of the boosted voltage VPP and the line of the read operation voltage VREAD outside the boot-up operation period in which the read operation voltage VREAD is not used in the fuse array 370, such that the line of the boosted voltage VPP and the line of the read operation voltage VREAD may be used when they are combined with each other. Since the third voltage generation block 350 generates the read operation voltage VREAD having the first target level or generates the read operation voltage VREAD having a third target level, according to the exit or entry of the boot-up operation period, the line of the boosted voltage VPP and the line of the read operation voltage VREAD may be normally connected with each other outside the boot-up operation period in which the read operation voltage VREAD is not used in the fuse array 370.

In detail, the third voltage generation block 350 generates the read operation voltage VREAD based on the third target level in the boot-up operation period, and generates the read operation voltage VREAD based on the first target level outside the boot-up operation period.

The third voltage detection unit 352 detects the level of the line of the read operation voltage VREAD based on the third target level in the boot-up operation period.

The third pumping unit 354 charge-pumps the line of the read operation voltage VREAD to the first target level in response to the output signal DET1 of the first voltage detection unit 312 outside the boot-up operation period. That is, the third pumping unit 354 causes the level of the line of the read operation voltage VREAD to be the same as the level of the line of the boosted voltage VPP, outside the boot-up operation period. Conversely, the third pumping unit 354 charge-pumps the line of the read operation voltage VREAD to the third target level in response to an output signal DET3 of the third voltage detection unit 352 in the boot-up operation period. That is, the third pumping unit 354 causes the level of the line of the read operation voltage VREAD to be different from the level of the line of the boosted voltage VPP, in the boot-up operation period.

The read detection selecting section 3542 selects the output signal DET1 of the first voltage detection unit 312 and outputs it as a signal SEL_READ outside the boot-up operation period, and selects the output signal DET3 of the third voltage detection unit 352 and outputs it as the signal SEL_READ in the boot-up operation period. That is, the signal SEL_READ outputted from the read detection selecting section 3542 is the output signal DET1 of the first voltage detection unit 312 outside the boot-up operation period, and is the output signal DET3 of the third voltage detection unit 352 in the boot-up operation period.

The read operation pump 3544 charge-pumps the line of the read operation voltage VREAD to the first target level in response to the signal SEL_READ outputted from the read detection selecting section 3542 outside the boot-up operation period. Further, the read operation pump 3544 charge-pumps the line of the read operation voltage VREAD to the third target level in response to the signal SEL_READ outputted from the read detection selecting section 3542 in the boot-up operation period.

In other words, the read operation pump 3544 charge-pumps the line of the read operation voltage VREAD to the first target level outside the boot-up operation period in which the line of the read operation voltage VREAD and the line of the boosted voltage VPP are connected with each other by the second connection control block 340. Accordingly, outside the boot-up operation period, the line of the read operation voltage VREAD and the line of the boosted voltage VPP may have the same level. The boosted voltage VPP and the read operation voltage VREAD, which are generated by the first voltage generation block 310 and the third voltage generation block 350 outside the boot-up operation period and have the first target level, are applied to the internal circuit 360 and are used to perform the preset operation. Since the fuse array 370 does not perform any operation outside the boot-up operation period, the boosted voltage VPP and the read operation voltage VREAD do not flow to the fuse array 370.

Further, the read operation pump 3544 charge-pumps the line of the read operation voltage VREAD to the third target level in the boot-up operation period in which the line of the read operation voltage VREAD and the line of the boosted voltage VPP are not connected with each other by the second connection control block 340. Accordingly, the read operation voltage VREAD with the third target level does not flow to the line of the boosted voltage VPP. Due to this fact, the internal circuit 360 may be exerted with no influence from the read operation voltage VREAD with the third target level. Conversely, the fuse array 370 may perform a boot-up operation for reading the data stored therein, by being applied with the read operation voltage VREAD with the third target level. When the read operation pump 3544 charge-pumps the line of the read operation voltage VREAD to the third target level, it may be seen that the read operation pump 3544 charge-pumps the line of the read operation voltage VREAD directly to the third target level by using the power supply voltage VDD, unlike the rupture pumping operating section 3344. The reason for this resides in that, it may be easy to stably pump the level of the power supply voltage VDD to the third target level at once because the third target level is lower than the first target level. Furthermore, because the first target level is higher than the third target level, if the boosted voltage VPP and the read operation voltage VREAD, which have the first target level that is relatively high, are transmitted to the fuse array 370 outside the boot-up operation period, an influence may be exerted on the fuse array 370. In order to prevent this, the third connection control block 380 is provided between the line of the read operation voltage VREAD and the fuse array 370.

In detail, the third connection control block 380 connects the line of the read operation voltage VREAD and the power input terminal of the fuse array 370 in the boot-up operation period, and disconnects the line of the read operation voltage VREAD and the power input terminal of the fuse array 370 outside the boot-up operation period. Namely, the third connection control block 380 connects the line of the read operation voltage VREAD and the power input terminal of the fuse array 370 in the boot-up operation period in which the read operation voltage VREAD is used in the fuse array 370, such that the read operation voltage VREAD with the third target level may be supplied to the fuse array 370.

Accordingly, in the boot-up operation period, the fuse array 370 is normally supplied with the read operation voltage VREAD with the third target level and performs the operation for reading the data stored therein. Conversely, the third connection control block 380 disconnects the line of the read operation voltage VREAD and the power input terminal of the fuse array 370 outside the boot-up operation period in which the read operation voltage VREAD is not used in the fuse array 370, such that the read operation voltage VREAD with the first level is not supplied to the fuse array 370. Accordingly, the fuse array 370 may not be supplied with the read operation voltage VREAD with the first target level outside the boot-up operation period, by which it may be possible to prevent an internal circuit from abnormally operating.

As can be seen, in the semiconductor device including the fuse array 370 in accordance with the embodiment of the present invention, the supply lines of the voltages VRUP and VREAD to be used in operations of the fuse array 370 and the supply line of the boosted voltage VPP to be used in the internal circuit 360 may be disconnected from each other.

Therefore, it may be possible to prevent the durability and reliability of the internal circuit 360, which uses the boosted voltage VPP with a relatively low level, from being degraded due to the rupture operation voltage VRUP of the fuse array 370 with a relatively high level.

Conversely, it may be possible to prevent the durability and reliability of the fuse array 370, which operates using the read operation voltage VREAD with a relatively low level, from being degraded due to the boosted voltage VPP, which is used in the internal circuit 360 while having a relatively high level.

Moreover, for example, the voltage generation blocks 330 and 350 for generating the rupture operation voltage VRUP and the read operation voltage VREAD to be used in only the fuse array 370 may be converted into a state for generating the boosted voltage VPP to be used in the internal circuit 360 during an operation period in which the fuse array 370 performs no operation. Therefore, the area occupied and current consumed by the voltage generation block 310 for generating the boosted voltage VPP to be used in the internal circuit 360 may be minimized.

As is apparent from the above descriptions, in the semiconductor device including a fuse array in accordance with the embodiments of the present invention, since the supply line of a voltage to be used in the operation of the fuse array and the supply line of a voltage to be used in an internal circuit (e.g., cell array) are disconnected from each other, it may be possible to minimize influences exerted on the operation voltage of the fuse array and the operation voltage of the internal circuit having different target levels, by each other.

Further, because a circuit for generating the operation voltage of the fuse array and a circuit for generating the operation voltage of the internal circuit are controlled to independently perform operations, by being disconnected from each other for the operation period of the fuse array, and are controlled to commonly generate the operation voltage of the internal circuit, in a period in which the fuse array does not operate, the area occupied by and the current consumed by a voltage generation circuit may be minimized.

Although various embodiments have been described for illustrative purposes, it will be apparent to those skilled in the art, that various changes and modifications may be made without departing from the spirit and scope of the disclosure as defined in the following claims.

What is claimed is:

1. A semiconductor device comprising:
   a fuse array including a plurality of fuses, and configured to operate using a fuse operation voltage in a fuse operation period;
   a first voltage generation block configured to generate an internal voltage based on a first target level;
   a second voltage generation block configured to generate the fuse operation voltage based on a second target level in the fuse operation period, and generate the fuse operation voltage based on the first target level outside the fuse operation period; and
   a connection control block configured to disconnect a line of the internal voltage and a line of the fuse operation voltage in the fuse operation period, and connect the line of the internal voltage and the line of the fuse operation voltage outside the fuse operation period.

2. The semiconductor device according to claim 1, wherein the first voltage generation block comprises:
   a first voltage detection unit configured to detect a level of the line of the internal voltage based on the first target level; and
   a first pumping unit configured to charge-pump the line of the internal voltage to the first target level in response to an output signal of the first voltage detection unit.

3. The semiconductor device according to claim 1, wherein the second voltage generation block comprises:
   a second voltage detection unit configured to detect a level of the line of the fuse operation voltage based on the second target level in the fuse operation period; and
   a second pumping unit configured to charge-pump the line of the fuse operation voltage to the first target level in response to the output signal of the first voltage detection unit outside the fuse operation period, and charge-pump the line of the fuse operation voltage to the second target level in response to an output signal of the second voltage detection unit in the fuse operation period.

4. The semiconductor device according to claim 3, wherein the second pumping unit comprises:
   a fuse detection selecting section configured to select and output the output signal of the first voltage detection unit outside the fuse operation period, and select and output the output signal of the second voltage detection unit in the fuse operation period; and
   a fuse pumping operating section configured to charge-pump the line of the fuse operation voltage to the first target level in response to an output signal of the fuse detection selecting section outside the fuse operation period, and charge-pump the line of the fuse operation voltage to the first target level and then charge-pump the line of the fuse operation voltage to the second target level, in response to an output signal of the fuse detection selecting section in the fuse operation period.

5. The semiconductor device according to claim 4, wherein the fuse pumping operating section comprises:
   a first fuse operation pump configured to charge-pump an intermediate pumping line of the line of the fuse operation voltage to the first target level in response to the output signal of the fuse detection selecting section; and
   a second fuse operation pump configured to start to operate after an operation of the first fuse operation pump is completed in the fuse operation period, and charge-pump a final pumping line of the line of the fuse operation voltage to the second target level based on a voltage level of the intermediate pumping line in response to the output signal of the fuse detection selecting section.

6. The semiconductor device according to claim 5, wherein the connection control block disconnects the line of the internal voltage and the intermediate pumping line in the fuse operation period, and connects the line of the internal voltage and the intermediate pumping line outside the fuse operation period.

7. The semiconductor device according to claim 1, wherein the first voltage generation block is enabled and generates the internal voltage outside the fuse operation period, and is disabled and performs no operation in the fuse operation period.

8. A semiconductor device comprising:
a fuse array including a plurality of fuses, and configured to rupture preset data by using a rupture voltage in a rupture operation period;
a first voltage generation block configured to generate a boosted voltage based on a first target level;
a second voltage generation block configured to generate the rupture voltage based on a second target level in the rupture operation period, and generate the rupture voltage based on the first target level outside the rupture operation period; and
a first connection control block configured to disconnect a line of the boosted voltage and a line of the rupture voltage in the rupture operation period, and connect the line of the boosted voltage and the line of the rupture voltage outside the rupture operation period.

9. The semiconductor device according to claim 8, wherein the first voltage generation block comprises:
a first voltage detection unit configured to detect a level of the line of the boosted voltage based on the first target level; and
a first pumping unit configured to charge-pump the line of the boosted voltage to the first target level in response to an output signal of the first voltage detection unit.

10. The semiconductor device according to claim 8, wherein the second voltage generation block comprises:
a second voltage detection unit configured to detect a level of the line of the rupture voltage based on the second target level in the rupture operation period; and
a second pumping unit configured to charge-pump the line of the rupture voltage to the first target level in response to the output signal of the first voltage detection unit outside the rupture operation period, and charge-pump the line of the rupture voltage to the second target level in response to an output signal of the second voltage detection unit in the rupture operation period.

11. The semiconductor device according to claim 10, wherein the second pumping unit comprises:
a rupture detection selecting section configured to select and output the output signal of the first voltage detection unit outside the rupture operation period, and select and output the output signal of the second voltage detection unit in the rupture operation period; and
a rupture pumping operating section configured to charge-pump the line of the rupture voltage to the first target level in response to an output signal of the fuse detection selecting section outside the rupture operation period, and charge-pump the line of the rupture voltage to the first target level and then charge-pump the line of the rupture voltage to the second target level, in response to an output signal of the fuse detection selecting section in the rupture operation period.

12. The semiconductor device according to claim 11, wherein the rupture pumping operating section comprises:
a first rupture operation pump configured to charge-pump an intermediate pumping line of the line of the rupture voltage to the first target level in response to the output signal of the rupture detection selecting section; and
a second rupture operation pump configured to start to operate after an operation of the first rupture operation pump is completed in the rupture operation period, and charge-pump a final pumping line of the line of the rupture voltage to the second target level based on a voltage level of the intermediate pumping line in response to the output signal of the rupture detection selecting section.

13. The semiconductor device according to claim 12, wherein the first connection control block disconnects the line of the boosted voltage and the intermediate pumping line in the rupture operation period, and connects the line of the boosted voltage and the intermediate pumping line outside the rupture operation period.

14. The semiconductor device according to claim 9, wherein data is read from the fuse array by using a read voltage in a boot-up operation period in an exit state of the rupture operation period.

15. The semiconductor device according to claim 14, further comprising:
a third voltage generation block configured to generate the read voltage based on a third target level in the boot-up operation period, and generate the read voltage based on the first target level outside the boot-up operation period; and
a second connection control block configured to disconnect a line of the read voltage and the line of the boosted voltage in the boot-up operation period, and connect the line of the read voltage and the line of the boosted voltage outside the boot-up operation period.

16. The semiconductor device according to claim 15, wherein the third voltage generation block comprises:
a third voltage detection unit configured to detect a level of the line of the read voltage based on the third target level in the boot-up operation period; and
a third pumping unit configured to charge-pump the line of the read voltage to the first target level in response to the output signal of the first voltage detection unit outside the boot-up operation period, and charge-pump the line of the read voltage to the third target level in response to an output signal of the third voltage detection unit in the boot-up operation period.

17. The semiconductor device according to claim 16, wherein the third pumping unit comprises:
a read detection selecting section configured to select and output the output signal of the first voltage detection unit outside the boot-up operation period, and select and output the output signal of the third voltage detection unit in the boot-up operation period; and
a read operation pump configured to charge-pump the line of the read voltage to the first target level or the third target level in response to an output signal of the read detection selecting section.

18. The semiconductor device according to claim 15, wherein the first voltage generation block is enabled and generates the boosted voltage outside the rupture operation period and the boot-up operation period, and is disabled and performs no operation in the rupture operation period or the boot-up operation period.

19. The semiconductor device according to claim 15, further comprising:

a third connection control block configured to connect the line of the read voltage and a power input terminal of the fuse array in the boot-up operation period, and disconnect the line of the read voltage and the power input terminal of the fuse array outside the boot-up operation period.

20. A method of operating a semiconductor device including a fuse array and an internal circuit, the method comprising:

generating a fuse operation voltage for the fuse array based on a first target level outside a fuse operation period while connecting a line of the fuse operation voltage and a line of an internal voltage for the internal circuit; and generating the fuse operation voltage based on a second target level, which is higher than the first target level, in the fuse operation period while disconnecting the line of the fuse operation voltage from the line of the internal voltage.

* * * * *